US008658299B2

(12) United States Patent
Yang et al.

(10) Patent No.: US 8,658,299 B2
(45) Date of Patent: Feb. 25, 2014

(54) BATTERY PACK THERMAL MANAGEMENT SYSTEM AND METHOD

(75) Inventors: Jihui Yang, Lakeshore (CA); Steven Cai, Macomb, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 293 days.

(21) Appl. No.: 13/100,024

(22) Filed: May 3, 2011

(65) Prior Publication Data

US 2012/0282497 A1 Nov. 8, 2012

(51) Int. Cl.
*H01M 10/50* (2006.01)

(52) U.S. Cl.
USPC .............................. 429/62; 429/61; 429/120

(58) Field of Classification Search
None
See application file for complete search history.

(56) References Cited

U.S. PATENT DOCUMENTS

| | | | |
|---|---|---|---|
| 4,229,687 A * | 10/1980 | Newman | 320/112 |
| 7,027,290 B1 | 4/2006 | Thrap | |
| 7,126,312 B2 | 10/2006 | Moore | |
| 7,193,392 B2 | 3/2007 | King et al. | |
| 7,245,108 B2 | 7/2007 | Chertok et al. | |
| 7,253,353 B2 | 8/2007 | Stabler | |
| 7,378,818 B2 | 5/2008 | Fowler et al. | |
| 7,384,704 B2 | 6/2008 | Scott | |
| 2004/0013913 A1 * | 1/2004 | Fabis et al. | 429/13 |
| 2008/0213652 A1 * | 9/2008 | Scheucher | 429/62 |
| 2008/0311466 A1 | 12/2008 | Yang et al. | |
| 2010/0047682 A1 | 2/2010 | Houchin-Miller et al. | |
| 2010/0101878 A1 | 4/2010 | Yoshida et al. | |
| 2010/0119921 A1 | 5/2010 | Meijering et al. | |

OTHER PUBLICATIONS

SAE Standard J2711, "Recommended Practice for Measuring Fuel Economy & Emissions of Hybrid-Electric & Conventional Heavy-Duty Vehicles," Sep. 2002 (68 pgs).
SAE Standard J228 "Life Cycle Testing of Electric Vehicle Battery Modules," Jan. 1997 (5 pgs).
SAE Standrad J1798, "Recommended Practice for Performance Rating of Electric Vehicle Battery Modules," Jan. 1997 (16 pgs).
Berdichevsky, G., et al, "The Tesla Roadster Battery System," Tesla Motors, Dec. 2007 (5 pgs).
Pesaran, "Thermal Performance of EV & HEV Battery Modules & Packs," Natl Renevyable Energy Laboratory, date unknown (11 pgs).
Swan, D., "EV-Battery Pack Design & Performance for a Canadian Winter," DHS Engineeering Inc, Electric Mobility Canada (EMC), Nov. 2009 (7 pgs).
Martinez, C., "Cell Balancing Maximizes the Capacity of Multi-Cell Li-Ion Battery Packs," Intersil Corp,, http://analogzone.com, date unknown (5 pgs).

* cited by examiner

*Primary Examiner* — Milton I Cano
*Assistant Examiner* — Carmen Lyles-Irving
(74) *Attorney, Agent, or Firm* — Dierker & Associates, P.C.

(57) ABSTRACT

A battery pack thermal management system includes a plurality of battery cells connected to at least one DC power bus. At least one thermoelectric device is operatively disposed in thermal contact with the plurality of battery cells. At least one temperature measuring device is operatively connected to the thermal management system, and configured to measure a temperature of a predetermined portion of the plurality of battery cells. A cell balancing circuit is operatively connected to the plurality of battery cells, and configured to selectively divert a portion of electric current from at least one of the plurality of battery cells to the at least one thermoelectric device. An electronic controller is operatively connected to the cell balancing circuit, and configured to control a flow of electric current to the at least one thermoelectric device.

15 Claims, 2 Drawing Sheets

US 8,658,299 B2

BATTERY PACK THERMAL MANAGEMENT SYSTEM AND METHOD

TECHNICAL FIELD

The present disclosure relates generally to battery pack heating and cooling systems and control thereof.

BACKGROUND

Battery cells in a battery pack are generally not completely identical. Individual battery cells in a battery pack may tend to operate at different temperatures and voltages even though the individual battery cells are of the same model and time-in-service. Non-uniformity in the voltage among individual battery cells has been balanced using resistive loads. The energy dissipated by the resistive loads is generally wasted energy. The service life of a battery may be deleteriously affected by operation outside of a normal operating temperature band.

SUMMARY

A battery pack thermal management system includes a plurality of battery cells connected to at least one DC power bus. At least one thermoelectric device is operatively disposed in thermal contact with the plurality of battery cells. At least one temperature measuring device is operatively connected to the thermal management system, and configured to measure a temperature of a predetermined portion of the plurality of battery cells. A cell balancing circuit is operatively connected to the plurality of battery cells, and configured to selectively divert a portion of electric current from at least one of the plurality of battery cells to the at least one thermoelectric device. An electronic controller is operatively connected to the cell balancing circuit, and configured to control a flow of electric current to the at least one thermoelectric device.

BRIEF DESCRIPTION OF THE DRAWINGS

Features and advantages of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Electric Vehicles and Hybrid Electric Vehicles may include electric batteries for storing electrical energy. The batteries may be charged at a charging station, or by charging systems onboard the vehicle. Examples of onboard charging systems include regenerative braking energy recovery systems and generators powered by internal combustion engines. The batteries may provide electrical energy for accelerating the vehicle and for powering accessories including entertainment systems, instruments, gauges and lighting, control systems, heating, ventilation and cooling systems, and other electrically powered devices included in or connected to the vehicle.

In order to store useable energy, a vehicle may have a battery pack that includes a plurality of individual battery cells. The individual cells in the battery pack may be connected in series, parallel or combinations thereof. A state of charge (SOC) of individual battery cells may vary relative to other individual battery cells in the same battery pack. As used herein, the term SOC is based on the actual measured energy content of a battery and is expressed as a percentage of the battery's maximum rated Ampere hour (Ah) capacity (see, e.g., SAE J2711). The variation in SOC from cell to cell may be caused by e.g., manufacturing variability (resistance, capacity, self discharge, etc.), thermal characteristics and monitoring circuit loads. SOC variation can result in overcharge of cells with a high relative SOC. Cell balancing to actively set all cells in a pack to substantially the same SOC may prevent overcharge of cells that exhibit a high SOC without balancing. Preventing overcharging of battery cells may improve useful life of the individual cells and the entire battery pack.

A resistive cell balancing circuit, in which a resistive load is added to a cell or group of cells may be used for SOC balancing. In an example of resistive cell balancing, a resistive cell balancing circuit could bypass up to 200 mA per cell. Except in cases where the resistive heat is considered desirable and is usable, the bypassed 200 mA could be considered as generating waste heat. (Recalling Joule's First Law: the energy lost each second, or power, increases as the square of the current and in proportion to the electrical resistance of a conductor.) Thus, some of the usable energy of the battery pack may be substantially lost without performing any useful function. Such energy loss aggregated for an entire battery pack for a period of time could, for example, amount to approximately 100 W-120 W of electrical power loss. As disclosed herein, the electrical power from cell balancing may be used to power thermoelectric devices to cool or heat battery cells and improve the useful life of individual cells and the battery pack.

Figure 1:
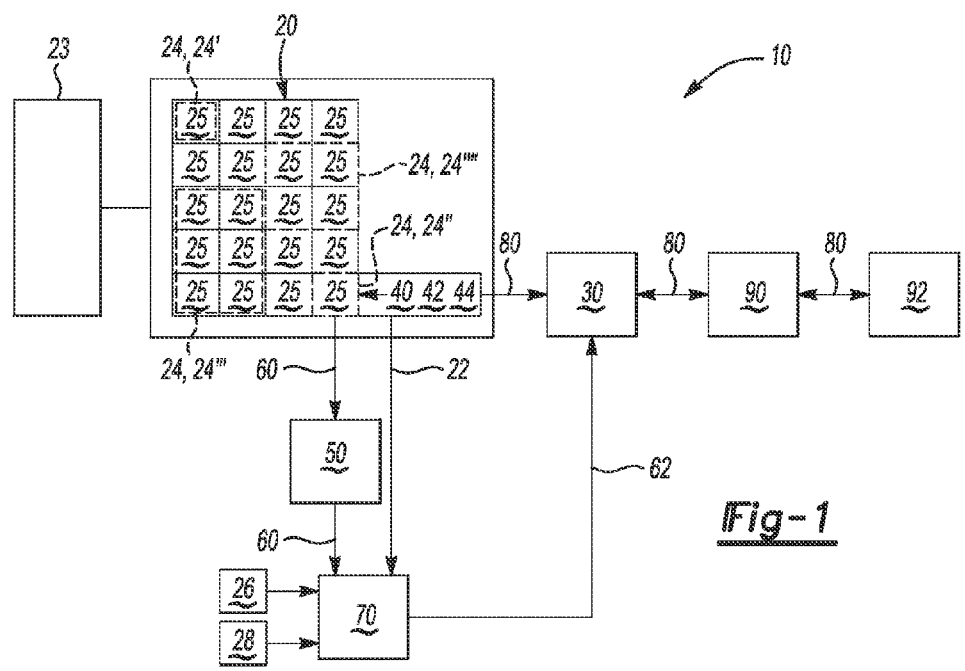
FIG. 1 is a schematic diagram depicting an example of a battery pack thermal management system of the present disclosure.

Referring now to FIG. 1, in an example, a battery pack thermal management system 10 includes a plurality 20 of battery cells 25 connected to at least one DC power bus 23. At least one thermoelectric device 30 is operatively disposed in thermal contact with the plurality 20 of battery cells 25. At least one temperature measuring device 40 is operatively connected to the thermal management system 10, and configured to measure a temperature 22 of a predetermined portion 24 of the plurality 20 of battery cells 25. It is to be understood that the temperature measuring device 40 could be a non-contacting sensor (e.g., an IR sensor) or a contacting sensor (e.g., a thermocouple). It is to be further understood that, as used herein, the predetermined portion 24 may be a portion of a single cell 25 (e.g., as shown schematically at 24' in FIG. 1), an entire cell 25 (e.g., as shown schematically at 24" in FIG. 1), a portion of a group of cells 25 (e.g., as shown schematically at 24'" in FIG. 1), or an entire group of cells 25 (e.g., as shown schematically at 24"" in FIG. 1).

A cell balancing circuit 50 is operatively connected to the plurality 20 of battery cells 25, and configured to selectively divert a portion 60 of electric current from at least one of the plurality 20 of battery cells 25 to the at least one thermoelectric device 30 via an electronic controller 70. In an example, the portion 60 of electric current diverted may be between about 0 mA and about 200 mA per battery cell 25. The electronic controller 70 is operatively connected to the cell balancing circuit 50, and configured to control a flow 62 of electric current to the at least one thermoelectric device 30.

It is to be understood that the battery cell 25 may be any type of rechargeable electrochemical battery cell. Examples of battery cells 25 contemplated as being within the purview of the present disclosure include lithium ion battery cells 21 (shown in FIGS. 4 and 5), nickel metal hydride battery cells, lead-acid battery cells, nickel-cadmium battery cells, and the like.

It is to be further understood that battery cells 25 in the plurality 20 of battery cells 25 may exhibit temperature gradients if no temperature regulating system is included. Temperature gradients may be observable through a volume of an individual battery cell 25, or through a volume of the plurality 20 of battery cells 25. For example, a particular individual battery 25 may be hotter than the batteries 25 that surround the particular individual battery 25. In some cases, the temperature gradient may be according to a predictable pattern. For example, battery cells 25 in the center of the plurality 20 of battery cells 25 may tend to be hotter than batteries 25 near an edge of the plurality 20. In such a case, the temperature of a remote portion of the plurality 20 of battery cells 25 may be inferred based on an observed temperature of another portion of the plurality 20 of battery cells 25. When all of the battery cells 25 in the plurality 20 of battery cells 25 are maintained at substantially the same temperature, all of the battery cells 25 in the plurality 20 of battery cells 25 will tend to have a similar useful life.

Figure 4:
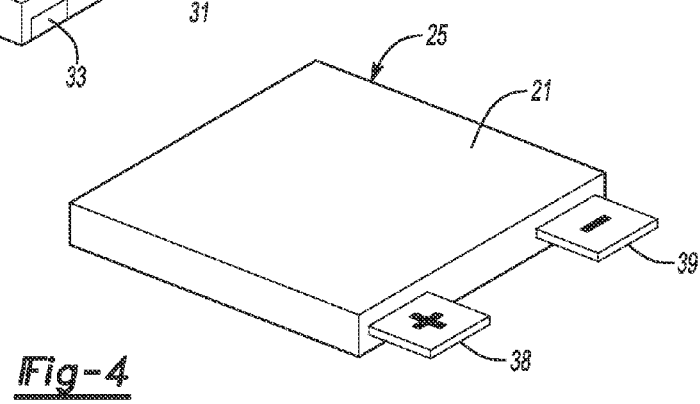
FIG. 4 depicts an example of a Li-ion battery used in an example of the system of the present disclosure.

As used herein, a battery cell 25 is useful if the amount of electrical energy storable within the battery cell 25, and releasable by the battery cell 25 through the battery terminals 38, 39 (as shown in FIG. 4) is within predetermined limits. As used herein, the term "useful life" means the duration in which a battery is useful after it is put into service. The useful life of a rechargeable battery may be expressed in charge/discharge cycles, units of time, or combinations thereof. It is to be understood that the useful life of a battery generally depends on environmental factors including temperature and vibration, as well as electrical load factors including duration and depth of cycles. It may be useful to have a standard set of conditions to allow comparison of batteries. SAE Surface Vehicle Recommended Practice J2288 is an example of a standardized test method to determine the expected service life, in cycles, of electric vehicle battery modules.

As schematically depicted in FIG. 1, the at least one temperature measuring device 40 may be a non-contacting sensor 42 (e.g., at least one thermal imaging device, such as an infrared (IR) sensor), a contacting sensor 44 (e.g., at least one temperature transducer, such as a thermocouple), or combinations thereof. In an example, an infrared thermal imaging device 42 may provide a thermal image of the plurality 20 of battery cells 25 with resolution such that a temperature of the predetermined portion 24 may be determined. In another example, a temperature transducer 44 such as a thermocouple may be attached to the predetermined portion 24, thereby measuring (with associated electronics) the temperature 22 of the predetermined portion 24 of the plurality 20 of battery cells 25.

Figure 2:
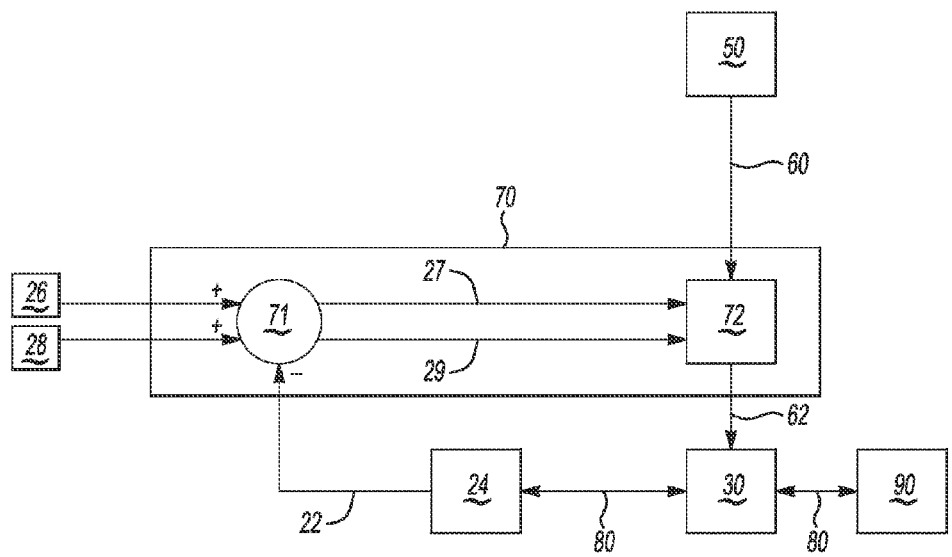
FIG. 2 is a schematic diagram of an example of a control system in an example of the system of the present disclosure.

Referring now to FIG. 2, in an example, the electronic controller 70 may be configured to compare (indicated by comparison element 71) the temperature 22 of the predetermined portion 24 of the plurality 20 of battery cells 25 to an upper temperature reference 26 and a lower temperature reference 28. The electronic controller 70 may generate an upper error value 27 and a lower error value 29 for the predetermined portion 24 of the plurality 20 of battery cells 25. The upper error value 27 may be generated by finding the difference between the temperature 22 and the upper temperature reference 26. Similarly, the lower error value 29 may be generated by finding the difference between the temperature 22 and the lower temperature reference 28. It is to be understood that digital and analog techniques may be employed to generate the upper and lower error values 27, 29.

The upper temperature reference 26 and the lower temperature reference 28 may be determined absolutely, or the reference temperatures 26, 28 may be calculated based on operating conditions. In an example of absolute reference temperatures, the upper temperature reference 26 may be set at 35° C., and the lower temperature reference may be set at 10° C. without regard to any real-time measurement. In an example of calculated references, an average of the temperature 22 of each battery cell 25 is calculated and is used as a reference temperature 26, 28.

The electronic controller 70 may include a distribution controller 72 to control the flow 62 of electric current to the at least one thermoelectric device 30 based on the upper error value 27 and the lower error value 29 for the predetermined portion 24 of the plurality 20 of battery cells 25. For example, if the upper error value 27 indicates that the temperature 22 of the predetermined portion 24 is high, the at least one thermoelectric device 30 will cool the predetermined portion 24 of the plurality 20 of battery cells 25. Continuing with the example, if the upper error value 27 and the lower error value 29 together indicate that the temperature 22 of the predetermined portion 24 is between the upper temperature reference 26 and the lower temperature reference 28, no current will be sent to the at least one thermoelectric device 30. Continuing further with the example, if the lower error value 29 indicates that the temperature 22 of the predetermined portion 24 is low, the at least one thermoelectric device 30 will heat the predetermined portion 24 of the plurality 20 of battery cells 25.

Figure 3:
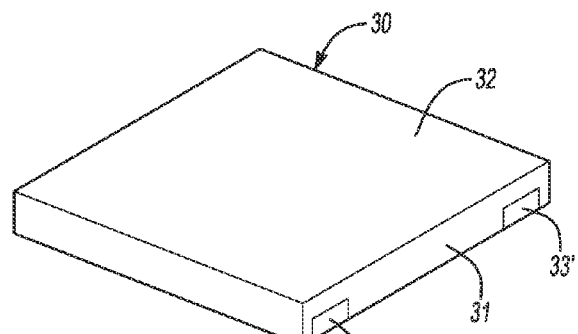
FIG. 3 is a semi-schematic depiction of an example of a Peltier device used in an example of the system of the present disclosure.

Referring now to FIG. 3, in an example, the at least one thermoelectric device 30 may be a Peltier device 32. An example of a suitable Peltier device 32 may be a Marlow RC12-8 Single-Stage Thermoelectric Cooler, available from Marlow Industries, Inc., 10451 Vista Park Road, Dallas Tex. 75238-1645. The Peltier device 32 depicted in FIG. 3 is flat with electrical contacts 33, 33' disposed on an edge 31 of the Peltier device 32.

FIG. 4 depicts an example of a lithium ion battery cell 21 used in an example of the battery pack thermal management system 10. The cell 21 shown in FIG. 4 is a flat cell with a positive terminal 38 and a negative terminal 39. Both terminals 38, 39 are blade terminals. Although a flat battery cell 21 with blade terminals 38, 39 is depicted in FIG. 4, batteries of other shapes and terminal styles are also contemplated as being within the purview of the present disclosure. For example, cylindrical batteries with end terminals for solderable connections (not shown) may be used. In examples with cylindrical batteries, a heat sink (not shown) may improve heat transfer between the cylindrical batteries and the thermoelectric device 30.

Figure 5:
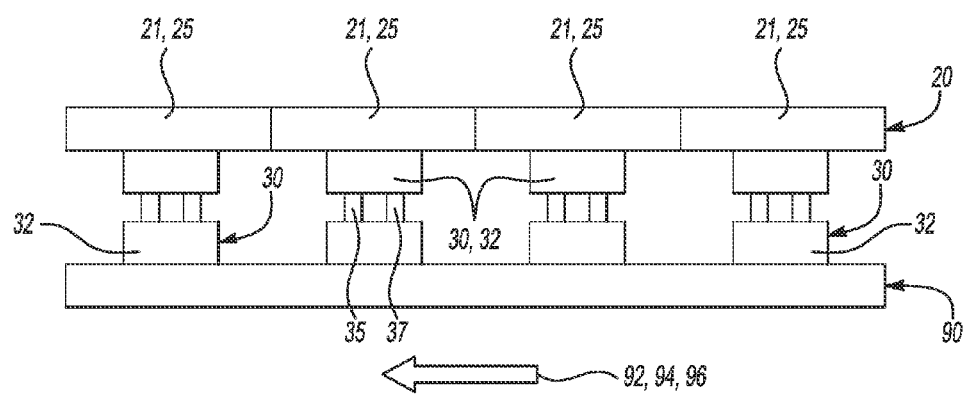
FIG. 5 is a semi-schematic depiction of an example of a thermoelectric device mounting relationship within an example of the system of the present disclosure.

Also referring now to FIG. 5, the at least one thermoelectric device 30 may be disposed in thermal contact with at least one thermally conductive structure 90 opposed to the plurality 20 of battery cells 25. The example depicted in FIG. 5 shows the at least one thermoelectric device 30 as having an n-type element 35 and a p-type element 37. The thermally conductive structure 90 may be, for example, a heat exchanger or a heat sink (e.g., an aluminum or copper heat sink). The at least one thermally conductive structure 90 may be disposed in thermal contact with a heat exchanging fluid 92. It is to be understood that the heat exchanging fluid 92 may be any suitable fluid, such as for example, air 94 or a liquid coolant 96.

In an example, a method for battery pack thermal management includes balancing a voltage of each battery cell 25 in a plurality 20 of battery cells 25 operatively connected to at least one DC power bus 23. Balancing may be accomplished, e.g., by shunting a portion 60 of electric current from at least one of the plurality 20 of battery cells 25 to the at least one thermoelectric device 30 in thermal contact with a predetermined portion 24 of the plurality 20 of battery cells 25. The method further includes determining a temperature 22 of the predetermined portion 24 of the plurality 20 of battery cells 25.

Still further, the example of the method includes controlling a magnitude and direction of the flow 62 of electric current flowing to the at least one thermoelectric device 30, thereby heating or cooling the predetermined portion 24 of the plurality 20 of battery cells 25.

As mentioned above, in an example, the controlling of electric current flowing to the at least one thermoelectric device 30 may be based on the upper error value 27 and the lower error value 29 respectively generated for the predetermined portion 24 of the plurality 20 of battery cells 25.

In an example, the portion 60 of electric current flowing to the at least one thermoelectric device 30 is proportional to the upper error value 27 or the lower error value 29.

Further examples may actively transfer heat 80 between the predetermined portion 24 of the plurality 20 of battery cells 25 and the at least one thermally conductive structure 90 operatively connected to the plurality 20 of battery cells 25 through the at least one thermoelectric device 30. In turn, heat 80 may be transferred between the at least one thermally conductive structure 90 and a heat exchanging fluid 92.

It is to be understood that numerical data have been presented herein in range format. It is to be understood that this range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, an electric current range from about 0 mA to about 200 mA should be interpreted to include not only the explicitly recited limits of about 0 mA and about 200 mA, but also to include discrete current values such as 0.5 mA, 10 mA, 25 mA, 50 mA, 127 mA, etc., and sub-ranges such as 0 mA to 25 mA, 0 mA to 110 mA, etc. Furthermore, when "about" is utilized to describe a value, this is meant to encompass minor variations (up to +/−5%) from the stated value.

Further, it is to be understood that the terms "connect/connected/connection", "contact/contacting", and/or the like are broadly defined herein to encompass a variety of divergent connected/contacting arrangements and assembly techniques. These arrangements and techniques include, but are not limited to (1) the direct communication between one component and another component with no intervening components therebetween; and (2) the communication of one component and another component with one or more components therebetween, provided that the one component being "connected to"/"in contact with" the other component is somehow in operative communication with the other component (notwithstanding the presence of one or more additional components therebetween).

While several examples have been described in detail, it will be apparent to those skilled in the art that the disclosed examples may be modified. Therefore, the foregoing description is to be considered non-limiting.

The invention claimed is:

1. A battery pack thermal management system, comprising:
   a plurality of battery cells connected to at least one DC power bus;
   at least one thermoelectric device operatively disposed in thermal contact with the plurality of battery cells;
   at least one temperature measuring device operatively connected to the thermal management system, and configured to measure a temperature of a predetermined portion of the plurality of battery cells;
   a cell balancing circuit operatively connected to the plurality of battery cells, and configured to selectively divert a portion of electric current from at least one of the plurality of battery cells to the at least one thermoelectric device; and
   an electronic controller directly and operatively connected to the cell balancing circuit, and configured to control a flow of electric current to the at least one thermoelectric device.

2. The battery pack thermal management system as defined in claim 1 wherein the electronic controller is configured to: compare the temperature of the predetermined portion of the plurality of battery cells to an upper temperature reference and a lower temperature reference; and generate an upper error value and a lower error value for the predetermined portion of the plurality of battery cells.

3. The battery pack thermal management system as defined in claim 2 wherein the electronic controller controls the flow of electric current to the at least one thermoelectric device based on the upper error value and the lower error value for the predetermined portion of the plurality of battery cells.

4. The battery pack thermal management system as defined in claim 1 wherein the at least one thermoelectric device is disposed in thermal contact with at least one thermally conductive structure opposed to the plurality of battery cells.

5. The battery pack thermal management system as defined in claim 4 wherein the at least one thermally conductive structure is disposed in thermal contact with a heat exchanging fluid.

6. The battery pack thermal management system as defined in claim 5 wherein the heat exchanging fluid is air or a liquid coolant.

7. The battery pack thermal management system as defined in claim 1 wherein the portion of electric current diverted is between about 0 mA and about 200 mA per battery cell.

8. The battery pack thermal management system as defined in claim 1 wherein the at least one temperature measuring device comprises a thermal imaging device, or at least one temperature transducer.

9. The battery pack thermal management system as defined in claim 1 wherein the at least one thermoelectric device is a Peltier device, and the plurality of battery cells includes lithium ion battery cells.

10. A method for battery pack thermal management, comprising:
    balancing a voltage of each battery cell in a plurality of battery cells operatively connected to at least one DC power bus by shunting a portion of electric current from at least one of the plurality of battery cells to at least one thermoelectric device in thermal contact with a predetermined portion of the plurality of battery cells;

determining a temperature of the predetermined portion of the plurality of battery cells;

comparing the temperature of the predetermined portion with an upper temperature reference and a lower temperature reference; and controlling a magnitude and direction of the flow of electric current flowing to the at least one thermoelectric device based upon the comparison, thereby heating or cooling the predetermined portion of the plurality of battery cells.

11. The method as defined in claim 10 wherein the at least one thermoelectric device is a Peltier device.

12. The method as defined in claim 10, further comprising:

generating an upper error value and a lower error value for the predetermined portion of the plurality of battery cells by respectively finding a difference between the temperature of the predetermined portion of the plurality of battery cells and the upper temperature reference and finding a difference between the temperature of the predetermined portion of the plurality of battery cells and the lower temperature reference; and when the upper error value indicates that the temperature of the predetermined portion of the plurality of battery cells is high, controlling the thermoelectric device to cool the predetermined portion of the plurality of battery cells; or when the lower error value indicates that the temperature of the predetermined portion of the plurality of battery cells is low, controlling the thermoelectric device to heat the predetermined portion of the plurality of battery cells.

13. The method as defined in claim 12 wherein the portion of electric current flowing to the at least one thermoelectric device is proportional to the upper error value or the lower error value.

14. The method as defined in claim 10, further comprising actively transferring heat between the predetermined portion of the plurality of battery cells and at least one thermally conductive structure operatively connected to the plurality of battery cells through the at least one thermoelectric device.

15. The method as defined in claim 14, further comprising transferring heat between the at least one thermally conductive structure and a heat exchanging fluid.

* * * * *